United States Patent [19]

Ehalt et al.

[11] Patent Number: 4,931,656
[45] Date of Patent: Jun. 5, 1990

[54] MEANS TO DYNAMICALLY DISCHARGE A CAPACITIVELY CHARGED ELECTRICAL DEVICE

[75] Inventors: Kenneth Ehalt, Merrick; William Sheng, Roslyn; Bernard L. Kravitz, Forest Hills, all of N.Y.

[73] Assignee: Dionics Inc., Westbury, N.Y.

[21] Appl. No.: 164,855

[22] Filed: Mar. 7, 1988

[51] Int. Cl.$^5$ .............................................. H01L 31/12
[52] U.S. Cl. .................................. 250/551; 307/311; 357/19
[58] Field of Search ........................... 250/214 R, 551; 307/311; 357/19

[56] References Cited

U.S. PATENT DOCUMENTS 4,754,175  6/1988  Kobayashi et al. ................. 250/551
4,755,697  7/1988  Kinzer .................................. 307/311

FOREIGN PATENT DOCUMENTS 273920  4/1985  Japan .
273921  4/1985  Japan .

Primary Examiner—David C. Nelms
Assistant Examiner—Stephone B. Allen
Attorney, Agent, or Firm—John H. Crozier

[57] ABSTRACT

A dynamic discharge circuit for a capacitively-charged electrical device includes, in one embodiment, a bipolar transistor placed in the discharge path, with the base of the transistor being connected so that conduction is held off by the voltage generated by an illuminated PV-diode. When the PV-diode is shut off, base-drive is immediately supplied through a base resistor in dynamic fashion by the very capacitive charge that is to be discharged. In another embodiment, the resistor is replaced with a diode-transistor combination, thus eliminating the delaying RC product inherent with the use of a resistor. In yet a further embodiment, an SCR placed in the discharge path is also dynamically driven. Discharge times on the order of about 5 microseconds are attained with the latter two embodiments and it is found that this discharge time is relatively constant regardless of the value of the capacitance to be discharged. The embodiments are described as being applied to the discharge of a capacitively-charged MOSFET in an optically-coupled solid state relay.

18 Claims, 2 Drawing Sheets

MEANS TO DYNAMICALLY DISCHARGE A CAPACITIVELY CHARGED ELECTRICAL DEVICE

BACKGROUND OF THE INVENTION

1. Field of the invention.

This invention relates to capacitively-charged electrical devices generally and, more particularly, to means for rapidly and dynamically discharging such devices.

2. Background Art.

While the present invention is described as being applied, in one embodiment, to the discharge of the gate-source capacitance of a MOSFET and, in a more specific embodiment, to the photo-voltaically charged gate-source capacitance of a MOSFET in an optically-coupled solid state relay, it will be understood that it may be applied as well in any case in which it is desired to rapidly discharge a capacitively-charged electrical device and such is within the intent of the invention.

In one type of optically-coupled solid state relay, the relay comprises, in one of its simplest forms, a light-emitting diode (LED), a photovoltaic (PV) generator chip, and a MOSFET power transistor. The LED and the photovoltaic generator chips are optically coupled by one of several methods so that the radiation from the LED falls on the PV chip. The PV chip typically comprises a monolithic series-connected array of photo-sensitive diodes, with each diode generating about 0.5 volts and a few micro-amps in response to the radiation emitted by the LED. Since the photosensitive diodes are connected in series, the generated voltages are summed, so that the array—typically 20 diodes—will generate about 10 volts as an output. This open-circuit voltage is then applied between the gate and the source terminals of the MOSFET, thus enabling it to conduct, or "turn on".

Part of the turn-on process involves the output current of the PV-chip charging the gate-source capacitance, permitting the MOSFET conduction to start. The higher the charging current from the PV-chip, the more quickly will the turn-on process proceed. The value of the current is dependent on many mechanical and process variables, chief among which are the distance from the LED to the PV-chip and the size of the diodes in the chip.

The "turn-off" process—cessation of MOSFET conduction—involves stopping the LED illumination by reducing the LED drive current to zero. This causes the photo-voltaic generation which was maintaining the MOSFET gate-source capacitance to collapse. That capacitance must now discharge before the MOSFET conduction will actually cease, so there is a finite time delay between the instant the LED is turned off and the actual cessation of MOSFET conduction. This time delay will depend both on the size of the gate-source capacitance and the type of discharge path or circuit through which it can discharge. Without some provision for enhanced discharge, the capacitance will discharge through stray leakage paths which may require on the order of several seconds before the MOSFET is turned off.

Any discharge path provided for enhanced turn-off has the possible adverse effect of hampering the gate-source charging for turn-on. Therefore, the discharge circuit is usually a compromise between the turn-off and turn-on times required. For example, early designs simply used a resistor in the discharge path between the gate and the source, with the resistor having a value low enough for reasonably fast discharge, yet not so low as to steal a significant fraction of the charging, or turn-on, current. Practical designs employing such a resistor typically have discharge times on the order of 500 microseconds to 1 millisecond, but ranging higher or lower depending on the size of the capacitance being discharged. The resistor approach leaves much to be desired, although it is simple to apply.

An improvement over the resistor approach is described in U.S. Pat. No. 4,390,790, issued June 28, 1983, to Rodriguez. That patent describes a discharge path in which the resistor is replaced with a depletion-mode JFET. This component has the property of acting like an infinitely high value resistor when its gate terminal is activated, thus "pinching off" the conduction path in which it is connected, yet it is capable of returning to conduction when its gate terminal has had its voltage reduced to zero. The voltage needed to control the JFET gate—several volts—is generated by a second PV-diode array optically coupled to the same LED that is illuminating the main PV-diode array. This approach reduces the MOSFET discharge time somewhat, i.e., to on the order of 150 microseconds, but being higher or lower depending on the size of the capacitance being discharged. Its main limitations, however, are that the JFET gate itself has a capacitance charge which must be discharged before the JFET can return to conduction and there must be a relatively high value resistor in its discharge path, with the value of the resistor being determined by the same considerations discussed above. This structure retains a fairly significant RC product, and is thus not inherently the fastest possible discharge path. The slower the JFET gate discharges, the longer will be the delay time in discharging the MOSFET gate. Thus, the JFET gate is left to discharge in a rather passive manner, and is not driven in any sense.

Accordingly, it is a principal object of the present invention to provide means for discharge of a capacitively-charged electrical device which allows shorter discharge time than known such means.

It is another object of the present invention to provide means for the rapid discharge of the gate-source capacitance of a turned-on MOSFET.

It is a further object of the present invention to provide means for the rapid discharge of the gate-source capacitance of a turned-on MOSFET which is incorporated in a optically-coupled solid state relay.

It is an additional object of the present invention to provide such means that produces a relatively constant turn-off time, regardless of the value of the capacitance to be discharged.

It is yet another object of the present invention to provide such means that is relatively temperature independent.

It is yet a further object of the present invention to provide such means that may be easily and efficiently designed and manufactured.

Other objects of the present invention will, in part, be obvious, and will, in part, be apparent from the following description and the accompanying drawing figures.

SUMMARY OF THE INVENTION

The present invention achieves the above objects, among others, by providing a dynamic discharge circuit for a capacitively-charged electrical device which includes, in one embodiment, a bipolar transistor placed in the discharge path, with the base of the transistor being connected so that conduction is held off by the voltage generated by an illuminated PV-diode. When the PV-diode is shut off, base-drive is immediately supplied through a base resistor in dynamic fashion by the very capacitive charge that is to be discharged. In another embodiment, the resistor is replaced with a diode-transistor combination, thus eliminating the delaying RC product inherent with the use of a resistor. In yet a further embodiment, an SCR placed in the discharge path is also dynamically driven. Discharge times on the order of about 5 microseconds are attained with the latter two embodiments and it is found that this discharge time is relatively constant regardless of the value of the capacitance to be discharged. The embodiments are described as being applied to the discharge of a capacitively-charged MOSFET in an optically-coupled solid state relay.

DESCRIPTION OF THE PREFERRED EMBODIMENTS

Figure 1:
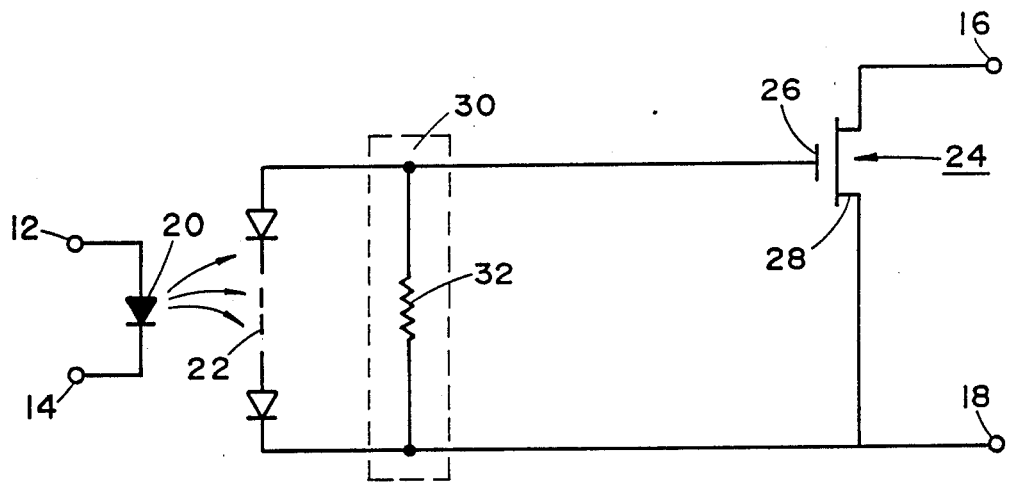
FIG. 1 is a schematic diagram of an optically-coupled relay including a discharge circuit employing a resistor.

Referring now to the Drawing, FIG. 1 shows, schematically, a prior art optically-coupled solid state relay, generally indicated by the reference numeral 10, having a pair of input terminals 12 and 14 and a pair of output terminals 16 and 18. Input terminals 12 and 14 are connected across LED 20 and, when a forward current of sufficient magnitude is applied between the input terminals, the LED will emit radiation which is received by a series-connected, monolithic, dielectrically-isolated PV-diode array 22 causing the array to develop a voltage. The voltage developed across array 22 is applied to a MOSFET 24 across its gate 26 and its source 28, thus charging the gate-source capacitance. Gate 26 is charged positively with respect to source 28, thus causing the MOSFET to conduct and making the path between output terminals 16 and 18 conductive. Connected across gate 26 and source 28 is a discharge circuit 30 which, in this case, simply comprises a resistor 32.

When it is desired to stop MOSFET 24 from conducting, the current across input terminals 12 and 14 is terminated and PV-diode array 22 ceases to produce voltage. At that instant, MOSFET 24 continues to conduct by virtue of the capacitance between gate 26 and source 28. However, as soon as the voltage produced by PV-diode array 22 ceases, the capacitance starts to discharge through resistor 32 in discharge circuit 30 and, when the capacitance has reached a sufficiently low magnitude, MOSFET 24 ceases to conduct and the path between output terminals 16 and 18 becomes open. In most practical applications, the value of resistor 32 is on the order of a few megohms and the turn-off time is on the order of about 500 microseconds to 1 millisecond, but ranging higher or lower depending on the size of the capacitance being discharged.

Figure 2:
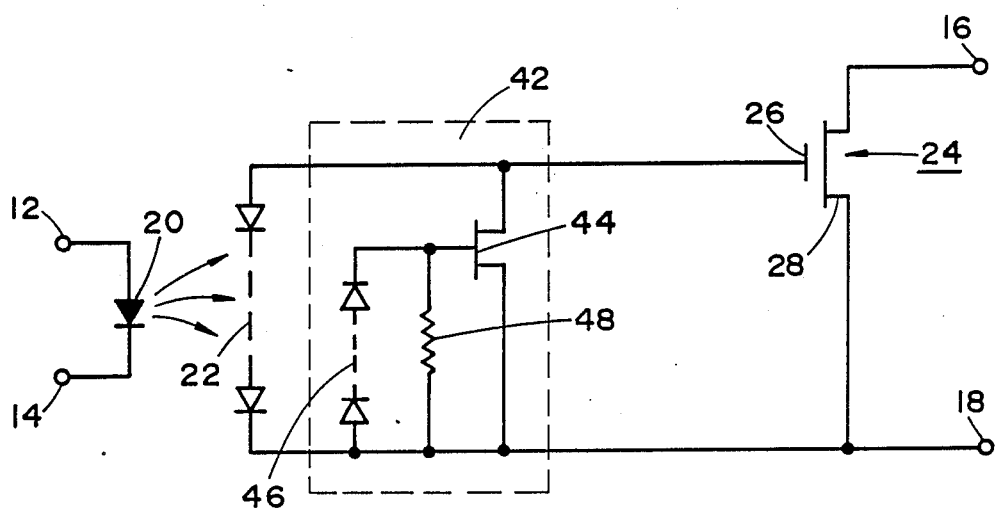
FIG. 2 is a schematic diagram of an optically-coupled relay including a discharge circuit employing a JFET.

FIG. 2 is a schematic representation of another optically-coupled solid state relay, generally indicated by the reference numeral 40, in which elements common to relay 10 of FIG. 1 have been given the same reference numerals as they have on FIG. 1. These common elements have the same function as described above with reference to the turning-on phase of the operation of relay 10. Relay 40 includes a discharge circuit 42 of another known type. Here, the primary element of discharge circuit 42 is a depletion-mode JFET 44 connected across gate 26 and source 28 of MOSFET 24. To maintain JFET 44 in a non-conductive state while MOSFET 24 is turned on, a second PV-diode array 46 is connected to the gate of the JFET, which array is activated by the same radiation from LED 20 that activates PV-diode array 22. When LED 20 ceases to radiate, second PV-diode array 46 will cease to generate voltage, but, similar to the discussion above with respect to the discharge of the capacitance between gate 26 and source 28 of MOSFET 24, JFET 44 continues to be turned off until its own internal capacitance discharges. To enhance this latter discharge, resistor 48 is provided between the gate and the source of JFET 44. Again, similar to the discussion above, the value of resistor 48 must be sufficiently high that the turning off of JFET 44 upon activation of relay 40 will not be unduly hampered. Thus, the turnoff time for relay 40 may be on the order of 150 microseconds, but being higher or lower depending on the size of the capacitance being discharged.

Figure 3:
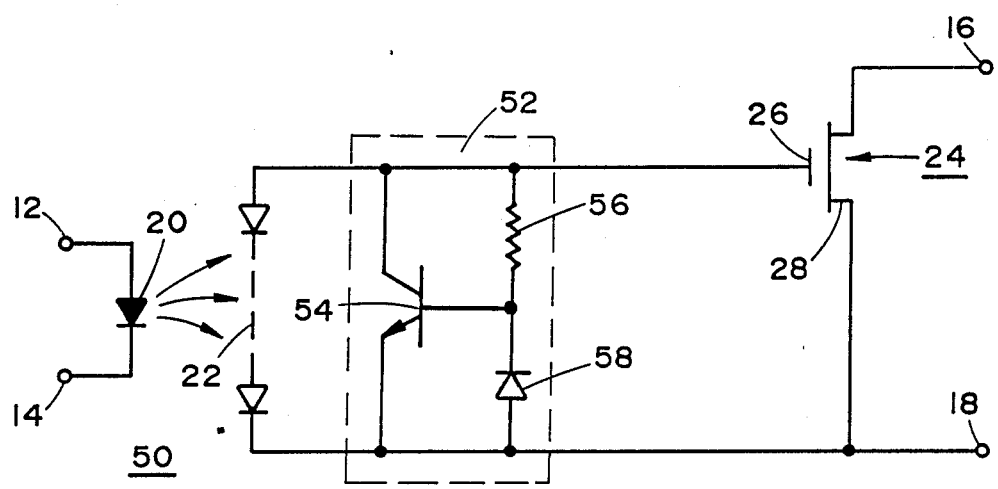
FIG. 3 is a schematic diagram of an optically-coupled relay including a discharge circuit, according to the present invention, employing a bipolar transistor with a resistor base drive.

FIG. 3 is a schematic representation of an optically-coupled relay, generally indicated by the reference numeral 50, and having elements common to those on relays 10 and 40 on FIGS. 1 and 2, respectively, given the same reference numerals. Relay 50 includes a discharge circuit 52, constructed according to one aspect of the present invention, having a bipolar NPN transistor connected as shown between the gate 26 and the source 28 of MOSFET 24, with the collector of the transistor at the potential of the gate and the emitter of the transistor at the potential of the source. Base drive to switch on transistor 54 and render it conductive is provided through resistor 56 connected between the base of the transistor and the gate 26 of MOSFET 24. Thus, transistor 54 is dynamically driven by the very capacitance that it is to discharge. During activation of relay 50, transistor 54 is held off of conductance by the voltage produced by a single PV-diode 58 connected between the source 28 of MOSFET 24 and the base of the transistor, which causes the base to be at a low potential relative to its emitter. PV-diode 58 is also illuminated by the radiation from LED 20 which illuminates PV-diode array 22. Thus, discharge circuit 52 of the present invention shown on FIG. 3 provides faster turn-off time and requires only one PV-diode as compared to the discharge circuit 42 of relay 40 on FIG. 2. However, the use of resistor 56 does cause some slowing of the discharging, dependent upon the capacitance of MOSFET 24.

Figure 4:
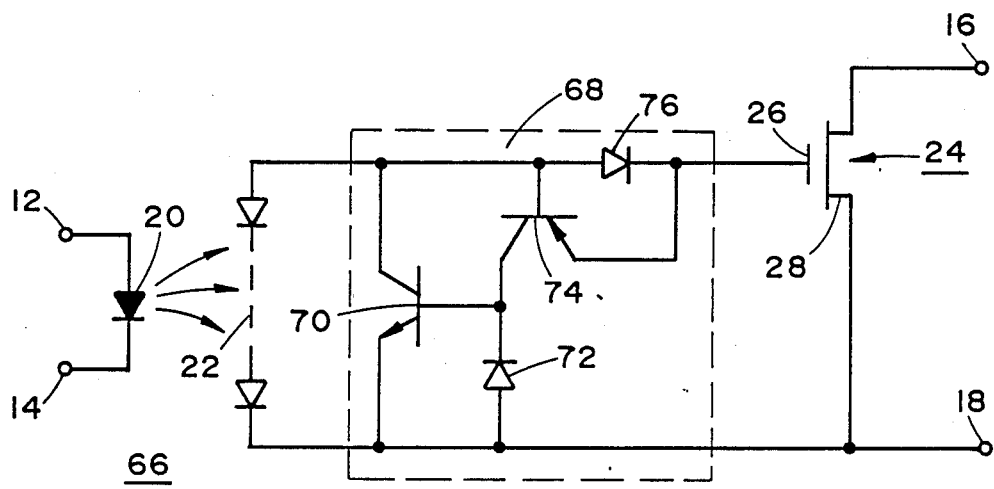
FIG. 4 is a schematic diagram of a variation of the relay of FIG. 3, employing a bipolar transistor with a non-resistor base drive.

FIG. 4 depicts another optically-coupled solid state relay, generally indicated by the reference numeral 66, again giving the elements common with previous figures common reference numerals, which relay includes a discharge circuit 68. Discharge circuit 68, constructed according to another aspect of the present invention, includes a bipolar NPN transistor 70 and a PV-diode 72 connected the same and having the same functions as transistor 54 and PV-diode 58 in discharge circuit 52 of relay 50 on FIG. 3. In this embodiment, however, the base drive resistor 56 of the former discharge circuit has been replaced with the combination of bipolar PNP transistor 74 and diode 76 connected as shown. When relay 66 is turned off, the base of transistor 74 becomes negative with respect to its emitter because of the placement of diode 76, transistor 74 conducts, and dynamic base drive is provided from the collector of transistor 74, while its emitter and base form part of the discharge path for the gate-source capacitance of MOSFET 24. Thus, with the elimination of a resistor in the discharge path, even faster discharge time is achieved, independent of the size of the capacitance of MOSFET 24.

Figure 5:
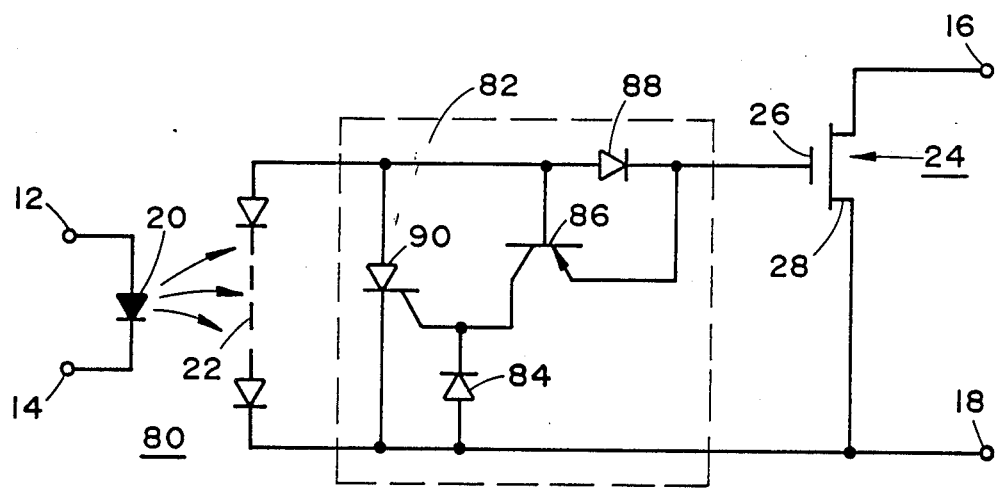
FIG. 5 is a schematic diagram of a variation of the relay of FIG. 4, in which the transistor of FIG. 4 is replaced with a SCR.

FIG. 5 shows a variation of the discharge circuit 68 of relay 66 on FIG. 4 and depicts another optically-coupled solid state relay, generally indicated by the reference numeral 80, having a discharge circuit 82. Discharge circuit 82 includes a PV-diode 84, a bipolar PNP transistor 86, and a diode 88 connected the same, and having the same functions, as elements 72, 74, and 76, respectively, on FIG. 4. Here, however, rather than having a transistor as the primary switching element, such as transistor 70 on FIG. 4, that transistor has been replaced with a silicon controlled rectifier (SCR) 90 which serves the same function as transistor 70. With this embodiment, the dynamic driving voltage is applied to the gate of SCR 90.

A particular additional advantage of the dynamic discharge circuits of FIGS. 4 and 5 is that such circuits are self-compensating in nature. That is, for example, the higher the value of the capacitance to be discharged, the stronger the drive on the base of the transistor, thus making that transistor more conductive and completing the discharge in a shorter time. This results in a discharge time that is almost constant, regardless of the value of the capacitance to be discharged. In the case of discharging MOSFETs, the value of the capacitance may range from a few tens of pico-farads (with relatively low-current MOSFETs) to several thousand pico-farads (MOSFETs capable of conducting several tens of amperes) and it is most desirable to have a dynamic discharge circuit that can accomplish turn-off in uniformly short times—typically on the order of 5 microsecond for the circuits described.

Another particular additional advantage of the present invention is that it has been found that the circuits described are relatively temperature independent.

It will be understood that, while the embodiments described for the present invention have employed devices of certain configurations, such devices of other configurations may also be employed with the necessary changes in interconnections to achieve proper polarities. For example, where a NPN transistor is shown, the use of a PNP transistor with the necessary changes in interconnections is within the intent of the invention. The use of a depletion-mode MOSFET with the invention instead of the enhancement-mode MOSFET shown and described, with the concomitant change in function, is also within the intent of the invention.

Additionally, the present invention may be employed in AC circuits, as well as the DC circuits shown on the drawing figures. Such applications might include, for example, the described circuits, but with two MOSFETs having common gate and source connections instead of the single MOSFET shown.

It is also within the intent of the invention to provide only a switching circuit of one of the embodiments described above for discharging capacitively-charged electrical devices, or providing an optically-coupled solid state MOSFET driver (or other drive circuit) for connection to a capacitively-charged output switching device (the MOSFET above, for example), or providing a complete solid state relay including all of the elements described for a preferred embodiment.

Whatever is provided within the invention, the elements thereof are preferably, but not necessarily, provided on a single, dielectrically-isolated, monolithic semiconductor chip by manufacturing means known in the art, as the circuits described are quite compatible with the processes used in manufacturing PV-diode array chips.

It will thus be seen that the objects set forth above, among those made apparent from the preceding description, are efficiently attained and, since certain changes may be made in the above constructions without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described, and all statements of the scope of the invention which, as a matter of language, might be said to fall therebetween.

We claim:

1. A dynamic discharge circuit for a capacitively-charged electrical device, said device having a first element with a positive charge and a second element with a negative charge, comprising:
    (a) a first conductor for attachment to said first element;
    (b) a second conductor for attachment to said second element;
    (c) a first transistor having its collector and emitter connected between said first and second conductor and having a first, nonconducting state and a second, conducting state; and
    (d) switching means to dynamically switch said transistor between said first and second states, whereby said electrical device may be capacitively charged when said transistor is in its first state and may be discharged when said transistor is in its second state, said switching means comprising:
        (i) drive means connected between the base of said first transistor and one of said first and second conductors at a first connection to provide base drive voltage to said transistor; and
        (ii) a photovoltaic diode connected between said base and the other of said first and second conductors to hold off conduction of said first transistor when said photovoltaic diode is illuminated and to allow conduction of said first transistor when said photovoltaic diode is not illuminated.

2. A circuit, as defined in claim 1, wherein said drive means comprises a resistor.

3. A circuit, as defined in claim 1, wherein said drive means comprises:

(a) a second transistor having its emitter and collector connected between said base of said first transistor and said one of said first and second conductors at a second connection between the connection of said first transistor and said electrical device, with the base of said second transistor connected to said one of said first and second conductors at a third connection between said connection of said first transistor and said second connection; and (b) a diode connected between said second and third connections, whereby, when said photovoltaic diode is not illuminated, voltage differential developed across said diode will cause said second transistor to conduct, thus providing basedrive voltage to said first transistor.

4. A circuit, as defined in claim 1, wherein said electrical device is a MOSFET, said first element is the gate of said MOSFET, and said second element is the source of said MOSFET.

5. A circuit, as defined in claim 1, wherein the discharge time of said electrical device is substantially independent of the size of the capacitance of said electrical device.

6. A solid state drive circuit, comprising:
(a) an LED;
(b) a PV-diode array optically-coupled to said LED;
(c) a first conductor connected to the anode end of said array for connection to a positively charged first element of an electrical device;
(d) a second conductor connected to the cathode end of said array for connection to a negatively charged second element of an electrical device;
(e) a first transistor having its collector and emitter connected between said first and second conductors; and
switching means to dynamically switch said first transistor between said first and second states, whereby said electrical device may be capacitively charged when said first transistor is in its first state and may be discharged when said first transistor is in its second state, said switching means comprising:
(i) drive means connected between the base of said first transistor and one of said first and second conductors at a first connection to provide base drive voltage to said first transistor; and
(ii) a photovoltaic diode connected between said base and the other of said first and second conductors to hold off conduction of said first transistor when said photovoltaic diode is illuminated and to allow conduction of said first transistor when said photovoltaic diode is not illuminated.

7. A circuit, as defined in claim 6, wherein said drive means comprises a resistor.

8. A circuit, as defined in claim 6, wherein said drive means comprises:
(a) a second transistor having it emitter and collector connected between said base of said first transistor and said one of said first and second conductors at a second connection between the connection of said first transistor and said electrical device, with the base of said second transistor connected to said one of said first and second conductors at a third connection between said connection of said first transistor and said second connection; and
(b) a diode connected between said second and third connections, whereby, when said photovoltaic diode is not illuminated, voltage differential developed across said diode will cause said second transistor to conduct, thus providing base-drive voltage to said first transistor.

9. A circuit, as defined in claim 6, wherein said electrical device is a MOSFET, said first element is the gate of said MOSFET, and said second element is the source of said MOSFET.

10. A circuit, as defined in claim 6, wherein the discharge time of said electrical device is substantially independent of the size of the capacitance of said electrical device.

11. A dynamic discharge circuit for a capacitively-charged electrical device, said device having a first element with a positive charge and a second element with a negative charge, comprising:
(a) a first conductor for attachment to said first element;
(b) a second conductor for attachment to said second element;
(c) a SCR having its cathode connected to said second conductor and having its anode connected to said first conductor at a first connection and having a first, nonconducting state and a second, conducting state; and
(d) switching means to dynamically switch between said first and second state, whereby said electrical device may be capacitively charged when said SCR is in its first state and may be discharged when said SCR is in its second state, said switching means comprising:
(i) drive means connected between the gate of said SCR and said first conductor to provide base drive voltage to said SCR; and
(ii) a photovoltaic diode connected between said gate of said SCR and said second conductor to hold off conduction of said SCR when said photovoltaic diode is illuminated and to allow conduction of said SCR when said photovoltaic diode is not illuminated.

12. A circuit, as defined in claim 11, wherein said drive means comprises:
(a) a transistor having its emitter and collector connected between said gate of said SCR and said first conductor at a second connection between said first connection and said electrical device, with the base of said transistor connected to said first conductor at a third connection between said first and second connections; and
(b) a diode connected between said second and third connections, whereby, when said photovoltaic diode is not illuminated, voltage differential across said diode will cause said transistor to conduct, thus providing gate-drive voltage to said SCR.

13. A circuit, as defined in claim 11, wherein the discharge time of said electrical device is substantially independent of the size of the capacitance of said electrical device.

14. A circuit, as defined in claim 11, wherein said electrical device is a MOSFET, said first element is the gate of said MOSFET, and said second element is the source of said MOSFET.

15. A solid state drive circuit, comprising:
(a) an LED;
(b) a PV-diode array optically-coupled to said LED;
(c) a first conductor connected to the anode end of said array for connection to a positively charged first element of an electrical device;

(d) a second conductor connected to the cathode end of said array for connection to a negatively charged second element of an electrical device;

(e) a SCR having its cathode connected to said second conductor and having its anode connected to said first conductor at a first connection and having a first, nonconducting state and a second, conducting state; and (f) switching means to dynamically switch said SCR between said first and second states, whereby said electrical device may be capacitively charged when said SCR is in its first state and may be discharged when said SCR is in its second state, said switching means comprising:

(i) drive means connected between the gate of said SCR and said first conductor to provide base drive voltage to said SCR; and (ii) a photovoltaic diode connected between said gate of said SCR and said second conductor to hold off conduction of said SCR when said photovoltaic diode is illuminated and to allow conduction of said SCR when said photovoltaic diode is not illuminated.

16. A circuit, as defined in claim 15, wherein said drive means comprises:

(a) a transistor having its emitter and collector connected between said gate of said SCR and said first conductor at a second connection between said first connection and said electrical device, with the base of said transistor connected to said first conductor at a third connection between said first and second connections; and (b) a diode connected between said second and third connections, whereby, when said photovoltaic diode is not illuminated, voltage differential across said diode will cause said transistor to conduct, thus providing gate drive voltage to said SCR.

17. A circuit, as defined in claim 15, wherein the discharge time of said electrical device is substantially independent of the size of the capacitance of said electrical device.

18. A circuit, as defined in claim 15, wherein said electrical device is a MOSFET, said first element is the gate of said MOSFET, and said second element is the source of said MOSFET.

* * * * *